United States Patent [19]
Marshall

[11] Patent Number: 6,020,822
[45] Date of Patent: Feb. 1, 2000

[54] CIRCUIT TESTER

[76] Inventor: Forrest A. Marshall, 615 Academy Ave., Dublin, Ga. 31021

[21] Appl. No.: 09/129,756

[22] Filed: Aug. 5, 1998

Related U.S. Application Data

[60] Provisional application No. 60/055,119, Aug. 6, 1997.

[51] Int. Cl.⁷ .................................................. G08B 21/00
[52] U.S. Cl. ...................... 340/654; 324/556; 324/133; 324/156; 324/72.5
[58] Field of Search ............................ 340/654; 324/555, 324/556, 114, 133, 156, 157, 72.5, 508; 379/21; 73/866.5

[56] References Cited

U.S. PATENT DOCUMENTS

| | | | |
|---|---|---|---|
| 4,041,380 | 8/1977 | Epstein | 324/556 |
| 5,394,093 | 2/1995 | Cervas | 324/556 |
| 5,572,143 | 11/1996 | Myers | 324/555 |
| 5,887,051 | 3/1999 | Sullivan et al. | 379/21 |

*Primary Examiner*—Julie Lieu
*Attorney, Agent, or Firm*—Dean W. Russell; Kilpatrick Stockton LLP

[57] ABSTRACT

A circuit tester which allows the testing of electrical outlets, telephone circuits and light bulb sockets. The circuit tester is cylindrical with two circuit probes. The first probe is a conventional two-prong electrical plug and the second is a conventional male light bulb connector. A standard telephone jack socket is provided on the side of the cylinder.

6 Claims, 3 Drawing Sheets

CIRCUIT TESTER

This application claims benefit of the priority date of U.S. Provisional Application Ser. No. 60/055,119 Aug. 6, 1997.

BACKGROUND OF THE INVENTION

Home construction, repair and remodeling projects often require installation or manipulation of electrical circuits, such as power outlets, light fixtures and telephone lines. Thus, it is often necessary to determine the status of these circuits in order to identify problems or prevent injury.

A wide variety of circuit testers are available which allow a user to determine the presence and magnitude of any electrical activity in the circuit. The vast majority of these devices, however, are designed to be used by professional electricians or people with some knowledge and expertise regarding electrical circuits. Moreover, such systems are typically designed for a variety of uses, such as testing exposed wires. Consequently, such testers usually provide two separate probes which are used to contact exposed electrical elements from which an electrical charge may be measured. For simpler applications, such as testing power outlets or light bulb sockets, such systems may be difficult and even dangerous to use—particularly in the hands of someone with little or no experience with electrical circuits.

Conventional testers typically do not allow the person testing the circuit to determine the status of the circuit from a remote location. For example, during construction projects, it is often important for a worker to know whether a particular outlet or circuit is "live." Very often, however, the circuit breakers which control power to various outlets are located in a different area of the construction project. In order to determine the status of the circuit, a worker will often plug in an electrical appliance or tool, such as a drill. The worker then switches on and off various circuit breakers until he or she hears tool turn on or off. While this approach is effective, it creates the hazard of an unattended operating electrical appliance.

Similarly, when performing home repairs, a individual may wish to know when a circuit is dead. A common approach to determine the status of a circuit is to station one person in the room where work is to be performed with a lamp or other appliance plugged into the outlet in question and while another person switches off breakers on the breaker panel until the lamp goes off, indicating that that circuit has been disabled. The person in the room then shouts to the person at the breaker board to indicate that the right breaker has been found. Obviously, this requires at least two individuals to perform the test, which may be impractical or inconvenient.

Thus, it would be desirable to provide in a single unit a circuit tester which may be used to test power outlets, light bulb sockets and telephone lines in a manner that safeguards the user from electrical shock or other related hazards. It also would be desirable to provide a circuit tester which allows a user to determine the status of a circuit from a remote location.

SUMMARY OF THE INVENTION

A circuit tester in accordance with the present invention comprises a single unit which allows the testing of electrical outlets, telephone circuits and light bulb sockets. The circuit tester is cylindrical with two circuit probes. The first probe is a conventional two-prong electrical plug and the second is a conventional male light bulb connector. A standard telephone jack socket is provided on the side of the cylinder.

A screw-on cap is provided which may be used to cover either the light bulb socket or the electrical plug. Lock-out switches on either end of the tester prevent either probe from being operated while the other is uncovered.

A visual indicator, such as an light-emitting diode (LED), illuminates when there is power in the circuit being tested. In addition, or alternatively, a buzzer may be provided which sounds when electricity is present in the circuit. The user may select between the buzzer or the LED or may use both simultaneously. Similarly, the user may switch between available testing functions, i.e., power outlet, light socket or telephone circuit. Because of difference between power and telephone circuits, different testing circuitry may be required to test telephone lines. Likewise, a separate display may be used to indicate the status of the telephone line.

Accordingly, it is an object of the present invention to provide a circuit tester which allows an inexperienced individual to test the status of an electrical circuit in a safe manner.

Another object of the present invention is to provide a circuit tester which allows an individual to test the status of a circuit from a remote location.

Other objects, features and advantages will be apparent to one skilled in the art by reference to the accompanying drawings, the following detailed descriptions of those drawings and the claims.

DETAILED DESCRIPTION

Figure 1:
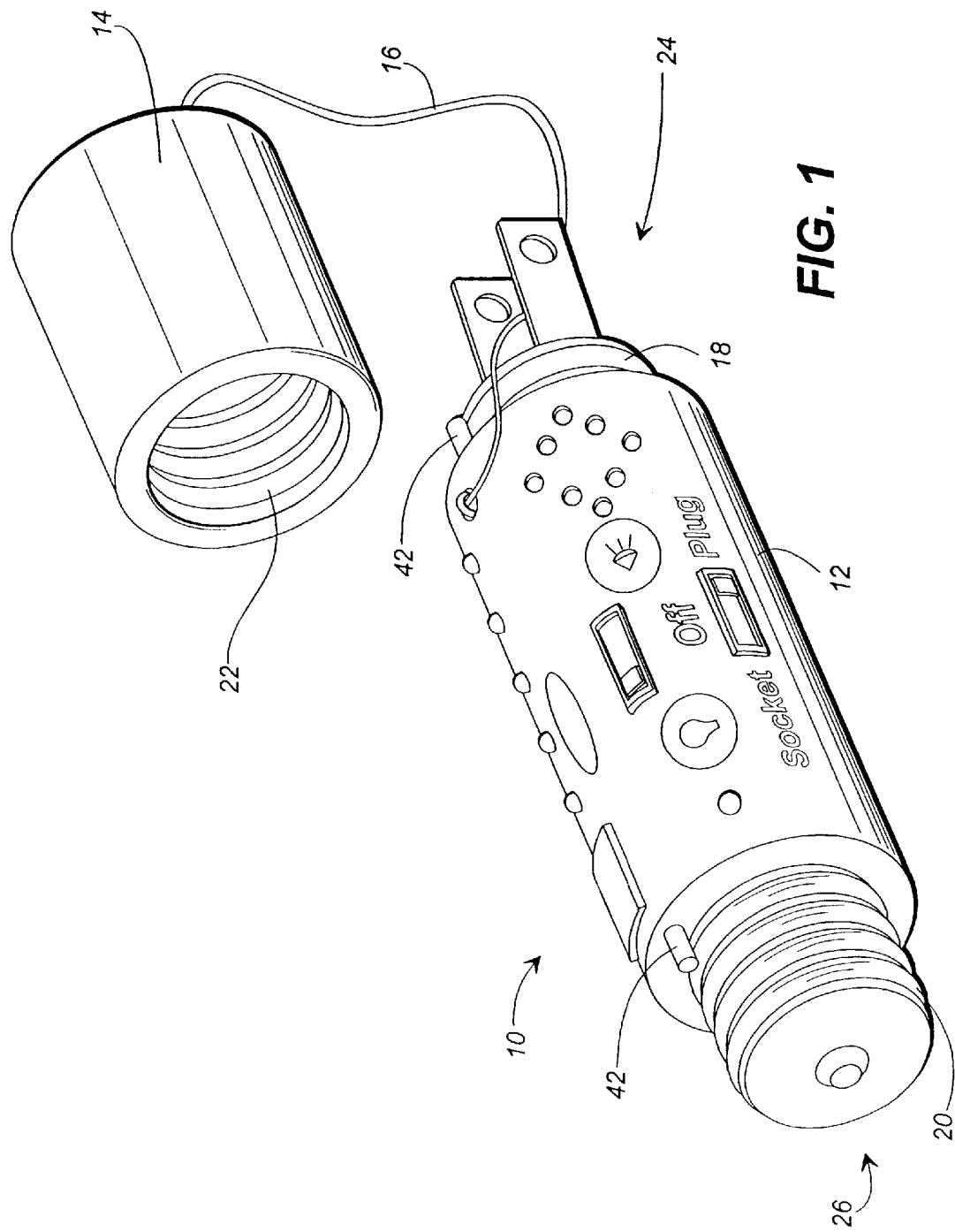
FIG. 1 is a perspective view of a circuit tester in accordance with the present invention.

FIG. 1 shows a circuit tester 10 in accordance with the present invention. Circuit tester 10 comprises tester body 12 and safety cap 14. Safety cap 14 may be secured to tester body 12 with a cord 16.

Figure 2:
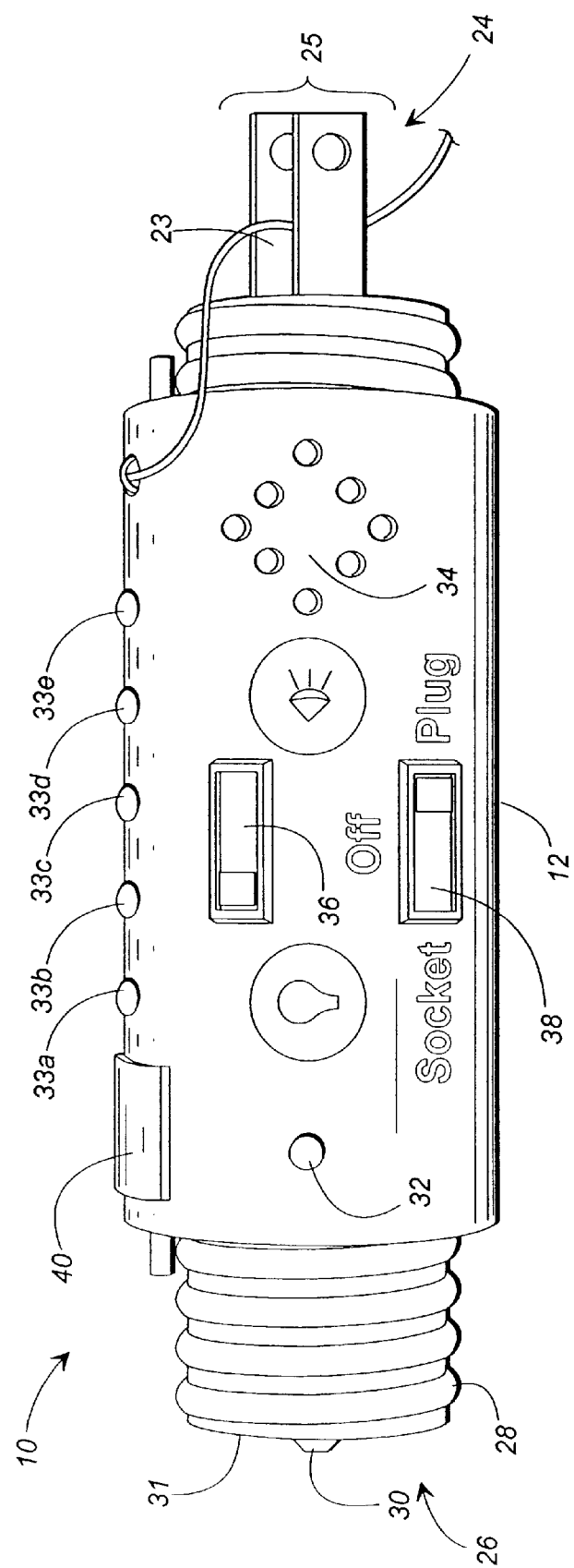
FIG. 2 is a plan view of the circuit tester of FIG. 1.

As shown in FIGS. 1 and 2, tester body 12 has threads 18 and 20. Threads 18 and 20 cooperate with internal threads 22 of safety cap 14 to secure safety cap 14 over plug end 24 or bulb end 26 of tester body 12. Momentary switches 42 are provided on circuit tester body 12 adjacent to threads 20 and 18. Each momentary switch 42 is positioned so as to be depressed when cap 14 is screwed down onto plug end 24 or bulb end 26 of tester body 12.

Protruding from plug end 24 of tester body 12 are two electrical prongs 23 which form outlet probe 25. Outlet probe 25 is adapted to fit into a conventional home power outlet. On light bulb end 26 of circuit tester 10 are threads 28 and contact 30 which form socket probe 31. Socket probe 31 is sized to fit into a conventional light bulb socket. Threads 28 and contact 30 function much like the conductors on a light bulb to carry power from a light bulb socket into tester 10.

LED 32 is positioned on tester body 12 so as to be easily visible. Similarly, buzzer 34 is positioned on tester body 12 such that it is unlikely to be obstructed or occluded. Two slider switches 36 and 38 are also provided on tester body 12. Switch 36 allows the user to switch between LED display 32 and speaker or buzzer 34. Switch 38 allows the user to switch between outlet probe 25 and socket probe 31. Telephone jack 40 is provided on the side of tester body 12. Telephone jack 40 is a conventional female telephone jack. Additional LEDs 33A–E are also positioned on tester body 12. LEDs 32 and 33A–E may be labeled to indicate tester functionality as described below.

Figure 3:
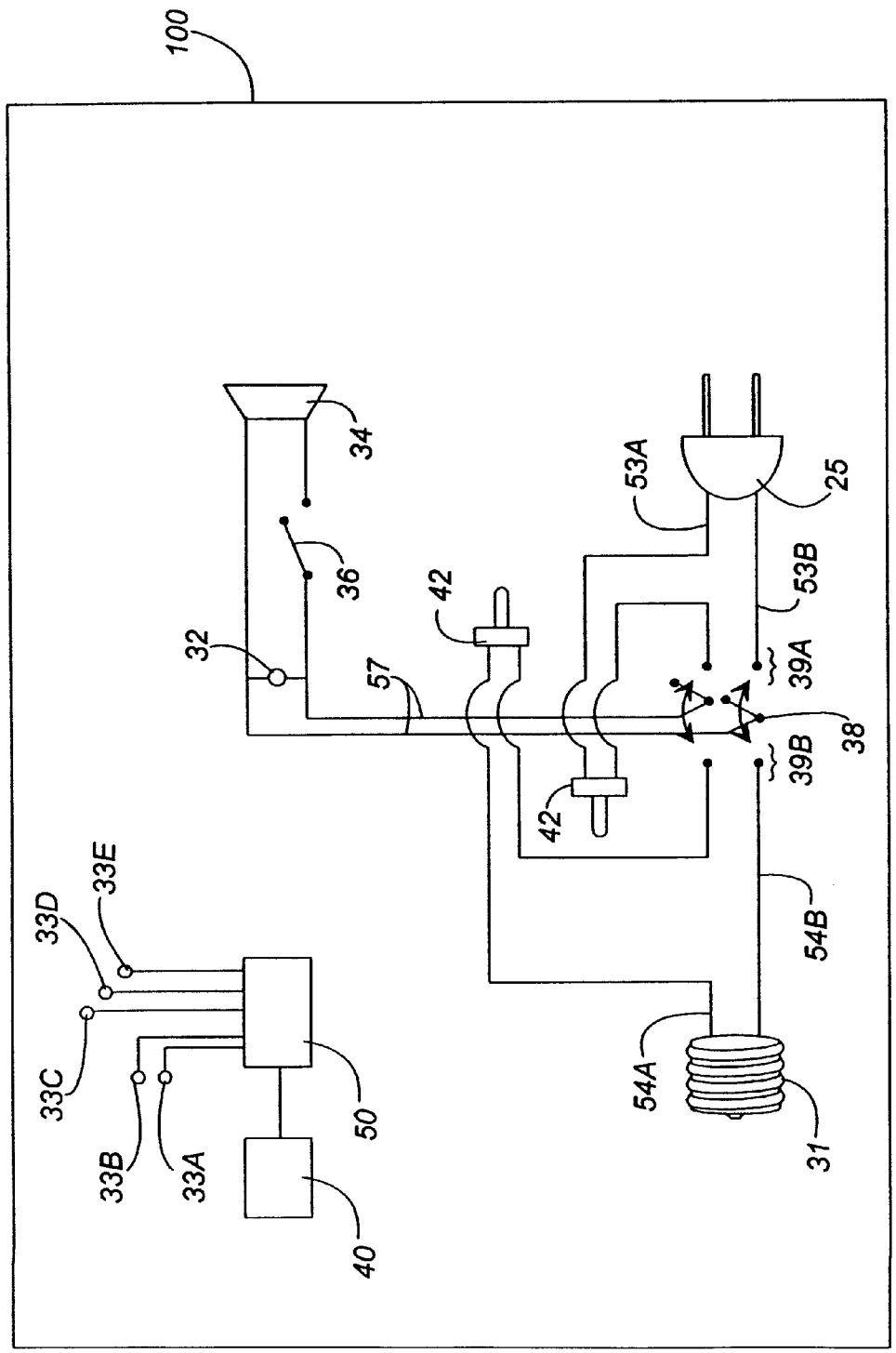
FIG. 3 is a circuit diagram of the circuit tester of FIG. 1.

FIG. 3 shows circuit layout 100 of circuit tester 10 in accordance with the present invention. Telephone jack 40 is connected to telephone circuit tester 50, which may be any circuit for testing the integrity and operation of a telephone line known to one skilled in the art. Telephone circuit tester 50 is connected to LEDs 33A–E. Each LED may be illuminated to indicate the status of the telephone line being tested. For example, if the telephone circuit has two lines, LEDs 33A and 33B may indicate which of the two lines is being tested. If the line being tested is not operational, LED 33C may be illuminated. If the line is operational, but wired incorrectly, e.g., with the reverse polarity, LED 33D may be illuminated. If the line is operational and correctly wired, LED 33E may be illuminated. Other means of displaying line status may be used as known to one skilled in the art. For instance, an LCD or other alphanumeric display may be used. Likewise different numbers and positioning of LEDs may be used as appropriate to indicate other possible line states and conditions.

Outlet probe 25 and socket probe 31 are connected to test mode switch 38 via lines 53A, B and 54A, B, respectively. Switch 38 is a double pole, double throw switch with a center-off position. When switch 38 is toggled to the center position, no signal from either outlet probe 25 or socket probe 31 is tested. When switch 38 is toggled to position 39A and cap 14 is screwed over socket probe 31, engaging momentary switch 42, outlet probe 25 sends a signal to LED 32 via line 57. Similarly, when switch 38 is toggled to position 39B and cap 14 is screwed over outlet probe 25, engaging momentary switch 42, socket probe 31 sends a signal to LED 32 via line 57. Connected to lines 57 is output switch 36, which may be toggled between visual (which connects lines 57 to LED 32) or audio/visual (which connects lines 57 to both LED 32 and buzzer 34) settings. Alternatively, switch 36 may have three positions, allowing three modes: visual, audio/visual or audio. When either outlet probe 25 or socket probe 31 is connected to a live power circuit through either outlet probe 25 or socket probe 31, a signal through line 57 illuminates LED 32 or illuminates LED 32 and sounds buzzer 34, depending on the position of switch 36 and provided the appropriate momentary switch 42 is depressed.

Momentary switches 42 are provided which interrupt lines 53A and 54A. Momentary switch 42 on line 53A must be depressed in order for outlet probe 25 to operate. Likewise, momentary switch 42 on line 54A must be depressed in order for socket probe 31 to operate. Thus, because switches 42 are depressed by cap 14, the user must screw on safety cap 14 over one probe in order to use the other. This arrangement keeps the unused probe elements from being exposed, thereby reducing the risk of electrocution.

In order to operate circuit tester 10, the user first selects which testing circuit is to be used. For instance, if a user wishes to test the status of a conventional power outlet, the user screws safety cap 14 over socket probe 31 and slides selector switch 38 into the position indicating outlet probe 25. The user then positions switch 36 to present a visual or audio/visual display. The user then inserts outlet probe 25 into the outlet to be tested. If LED 32 illuminates and/or buzzer 34 sounds, the circuit being tested is live. If there is no such indication, the circuit is dead.

If the user wishes to test the circuit from a remote location, as for instance, if the user wishes to identify which circuit breaker controls that particular outlet, the user may switch on buzzer 34, insert plug 25 of tester 10 into the desired outlet. If the buzzer sounds the user will know that that circuit is live. The user may then go to the circuit breaker box and switch on and off breakers until the sound cuts off. When sound ends, the user will know that the switch pulled is associated with the circuit being tested. The user may use the reverse of this process to identify which circuit breaker activates a dead circuit. Similar test procedures may be used to test light bulb sockets and telephone jacks.

The foregoing is provided for purposes of illustration, explanation, and description of an illustrative embodiment of a circuit tester in accordance with the present invention. Modifications and adaptations to this embodiment will be apparent to those skilled in the art and may be made without departing from the scope or spirit of the invention.

I claim:

1. An apparatus for testing circuits comprising:
    a) a housing;
    b) a telephone line testing circuit mounted in the housing;
    c) an outlet probe mounted on the housing;
    d) a light bulb probe mounted on the housing; and
    e) a circuit in communication with the outlet probe and the light bulb probe affixed within the housing.

2. The apparatus of claim 1 in which the circuit comprises:
    a) a visual indicator;
    b) an audible indicator; and
    c) a first switch in communication with the probes and the indicators for selecting an indicator mode.

3. The apparatus of claim 2 further comprising
    d) a second switch in communication with the probes for selecting a probe mode.

4. The apparatus of claim 3 further comprising a safety cap removably affixed to the housing in which the circuit further comprises at least one safety interrupt switch positioned on the housing such that the safety cap engages the safety interrupt switch when the cap is affixed to the housing.

5. The apparatus of claim 1 further comprising a safety cap removably affixed to the housing.

6. The apparatus of claim 1 further comprising at least one safety interrupt switch positioned on the housing such that the safety cap engages the safety interrupt switch when the cap is affixed to the housing.

* * * * *